United States Patent
Oda et al.

(10) Patent No.: US 6,759,143 B2
(45) Date of Patent: Jul. 6, 2004

(54) TANTALUM OR TUNGSTEN TARGET-COPPER ALLOY BACKING PLATE ASSEMBLY AND PRODUCTION METHOD THEREFOR

(75) Inventors: Kunihiro Oda, Ibaraki (JP); Takeo Okabe, Ibaraki (JP); Hirohito Miyashita, Ibaraki (JP)

(73) Assignee: Nikko Materials Company, Limited, Tokyo (JP)

(*) Notice: Subject to any disclaimer, the term of this patent is extended or adjusted under 35 U.S.C. 154(b) by 38 days.

(21) Appl. No.: 10/297,266

(22) PCT Filed: Jul. 30, 2001

(86) PCT No.: PCT/JP01/06553

§ 371 (c)(1),
(2), (4) Date: Dec. 2, 2002

(87) PCT Pub. No.: WO02/36848

PCT Pub. Date: May 10, 2002

(65) Prior Publication Data

US 2003/0134143 A1 Jul. 17, 2003

(30) Foreign Application Priority Data

Oct. 31, 2000 (JP) ........................................ 2000-332159

(51) Int. Cl.[7] ......................... B32B 15/01; C23C 14/34; B23K 20/00
(52) U.S. Cl. ....................... 428/662; 428/663; 228/194; 228/262.7; 204/298.13
(58) Field of Search ................................ 428/662, 663, 428/665, 652, 674; 148/535, 536; 228/194, 262.7; 204/298.12, 298.13

(56) References Cited

U.S. PATENT DOCUMENTS 5,836,506 A * 11/1998 Hunt et al. ................. 228/172
6,071,389 A * 6/2000 Zhang .................... 204/298.12
6,073,830 A * 6/2000 Hunt et al. ................. 228/203
6,113,761 A * 9/2000 Kardokus et al. ....... 204/298.13
6,620,296 B2 * 9/2003 Gogh et al. .............. 204/192.1
2001/0048019 A1 * 12/2001 Beier et al. ................. 228/193
2002/0003010 A1 * 1/2002 Shah et al. ................. 148/518

FOREIGN PATENT DOCUMENTS

| EP | 0590904 A1 | 4/1994 |
| EP | 0831155 A1 | 3/1998 |
| EP | 0848080 A1 | 6/1998 |
| JP | 62-202732 | 9/1987 |
| JP | 01-180976 | * 7/1989 |
| JP | 2000-239837 | 9/2000 |
| JP | 2000-239838 | 9/2000 |
| WO | WO 00/06793 | 2/2000 |

OTHER PUBLICATIONS

Patent Abstracts of Japan, One page English Abstract of JP 2000–239837.

Patent Abstracts of Japan, One page English Abstract of JP 2000–239838.

* cited by examiner

*Primary Examiner*—John J. Zimmerman
(74) *Attorney, Agent, or Firm*—Howson and Howson

(57) ABSTRACT

A tantalum or tungsten target-backing plate assembly which comprises a tantalum or tungsten target and a copper alloy backing plate that are subject to diffusion bonding via an aluminum- or aluminum alloy-sheet insert material at least 0.5 mm thick, and which is provided with diffusion bonded interfaces between the respective materials, wherein the assembly suffers only a small deformation after diffusion bonding and is free from separation between the target and the backing plate or from cracking even when the target material and the backing plate differ greatly in thermal expansion, and can survive high power sputtering; and a production method therefor.

2 Claims, 1 Drawing Sheet

TANTALUM OR TUNGSTEN TARGET-COPPER ALLOY BACKING PLATE ASSEMBLY AND PRODUCTION METHOD THEREFOR

FIELD OF THE INVENTION

The present invention pertains to a tantalum or tungsten target-copper alloy backing plate assembly capable of enduring high power sputtering, and to a production method therefor. Moreover, tantalum or tungsten as described in this specification shall include alloy targets having such components as the principal components.

BACKGROUND OF THE INVENTION

Diffusion bonding is an effective method as a bonding method of a sputtering target and backing plate capable of surviving high power sputtering, and the present applicants presented in Japanese Patent Laid-Open Publication No. H6-108246 a solid phase diffusion bond target assembly in which an insert material is inserted between the target and backing plate, and a production method thereof. The sputtering target assembly produced with this solid phase diffusion bonding has superior adhesiveness and strength.

Nevertheless, the sputtering target itself is being enlarged pursuant to the enlargement of the wafer aperture in recent years, and, in particular, the deformation after the diffusion bonding is becoming a serious problem in a case where the thermal expansion coefficients of the target material and the backing plate material differ greatly.

When the thermal expansion coefficient of the sputtering target is smaller in comparison to the backing plate (this is often the case in a target-backing plate assembly structure), with the target on top and the backing plate on bottom, such sputtering target will curve convexly upward when it is cooled from the temperature of the diffusion bonding to room temperature, and, when the diffusion bonding strength is weak, there are cases where such sputtering target will separate from the outer periphery of the bonding boundary.

Moreover, even if it did not separate, the amount of curvature would become large, and, in order to prescribe the thickness of the target, it is necessary to process (cut) the convex portion of a target previously thickened for the amount of curvature or to correct the curve at room temperature after the diffusion bonding. This would cause a problem of increasing the work process and ultimately increasing the cost.

In particular, with targets prepared with the powder metallurgical production method such as with tungsten, there would even be incidents where the target would crack if the amount of curve is too large.

As case examples having this kind of problem, it has been confirmed that this problem occurs frequently when tantalum or tungsten is used as the target material and aluminum or aluminum alloy is used as the backing plate.

Further, there were even cases where the coolant would leak as a result of the backing plate deforming due to the thermal influence of high power sputtering.

For example, upon diffusion bonding a tantalum target having a φ of 350 mm and a thickness of 10 mm with an aluminum alloy (A5052) backing plate in a vacuum, at 500° C. and bearing of 15 kgf/mm², the amount of curvature varied between 4 mm to 7 mm per lot, and in some cases the bonding boundary had separated.

And, upon processing a bonded assembly having a curvature of 4 mm into a shape of a target and performing sputtering thereto at a sputtering power of 20 KW, the target deformed and an accident of water leakage was observed.

OBJECTS OF THE INVENTION

An object of the present invention is to provide a tantalum or tungsten target-backing plate assembly which suffers only a small deformation after the diffusion bonding even when the target material and the backing plate differ greatly in the thermal expansion coefficient, is free from separation between the target and the backing plate or from cracking, and capable of surviving high power sputtering; and a production method therefor.

SUMMARY OF THE INVENTION

Thus, upon conducting an intense study in relation to the production of a tantalum or tungsten target diffusion bonded with a backing plate capable of surviving high power sputtering and having a minimal amount of curvature after the diffusion bonding, the present inventors have discovered that it is extremely effective to use copper alloy, which has a smaller thermal expansion coefficient than aluminum alloy, which is hard and difficult to deform, and which has favorable thermal conductivity, as the backing plate, and to use an aluminum- or aluminum alloy-sheet having a certain degree of thickness as the insert material. Based on the foregoing discovery, the present invention provides:

A tantalum or tungsten target-copper alloy backing plate assembly characterized in that a tantalum or tungsten target and a copper chrome alloy or copper zinc alloy backing plate are subject to diffusion bonding via an aluminum- or aluminum alloy-sheet insert material having a thickness between 2.0 mm or more and 6.0 mm or less, and which is provided with diffusion bonded interfaces between the respective materials, wherein the amount of curvature after bonding is 3 mm or less.

A production method of a tantalum or tungsten target-copper alloy backing plate assembly, characterized in that a tantalum or tungsten target and a copper chrome alloy or copper zinc alloy backing plate are subject to diffusion bonding via an aluminum- or aluminum alloy-sheet insert material having a thickness between 2.0 mm or more and 6.0 mm or less in a vacuum, at a temperature between 400° C. and 548° C., and under a pressure condition of 15 to 20 kg/mm², wherein the amount of curvature after bonding is 3 mm or less.

DETAILED DESCRIPTION OF THE PREFERRED EMBODIMENTS

Figure 1:
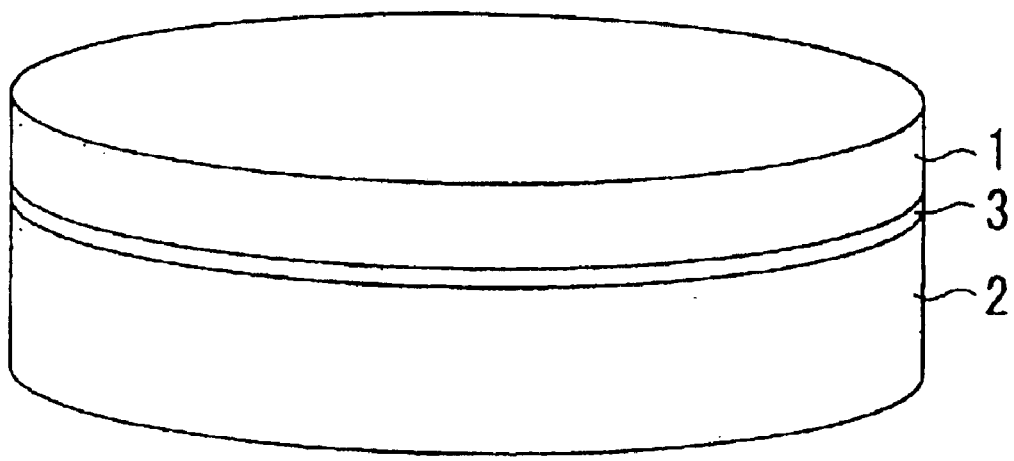
FIG. 1 is a schematic diagram of the assembly of the sputtering target, insert material and backing plate.

The present invention employs a copper alloy backing plate as the backing plate. Copper chrome alloy or copper zinc alloy, which has a smaller thermal expansion coefficient than aluminum alloy, which is hard and difficult to deform, and which has favorable thermal conductivity, is used as this copper alloy backing plate material.

An aluminum- or aluminum alloy-sheet having a thickness between 2.0 mm or more and 6.0 mm or less is used as the insert material. As described above, the reason it is necessary for the insert material to have a thickness of 2.0 mm or more is because it will thereby be sufficiently soft at the temperature during the diffusion bonding, atoms can be dispersed easily since an active new face will appear due to the destruction of the surface oxide film when viewed microscopically, and the stress generated with the difference in the thermal expansion coefficient between the sputtering target and backing plate when cooled to room temperature after the diffusion binding can be alleviated.

Conventionally, it has been said that it is better for the insert material to be thinner from the aspect of bonding strength and the like upon performing such diffusion bonding. The present invention, however, changes this conventional concept significantly.

When an insert material is not inserted, for example, the Vickers hardness of the tantalum target material is 109, and, on the other hand, the Vickers hardness of a copper chrome alloy backing plate is 135. Since both have a similar hardness, the destruction of the surface oxide film does not occur easily when viewed microscopically.

Therefore, since an active new face will not appear, it has become known that a phenomenon occurs where diffusion bonding becomes difficult. Moreover, it has also become known that when the insert material is thin, this is ineffective since the function of the insert material will decrease.

Due to the foregoing circumstances, for the production of a tantalum or tungsten target-copper alloy backing plate assembly, it is essential that an aluminum- or aluminum alloy-sheet having a thickness between 2.0 mm or more and 6.0 mm or less be used as the insert material.

For the production of a tantalum or tungsten target-copper alloy backing plate assembly, such assembly may be produced by inserting an aluminum- or aluminum alloy-sheet having a thickness between 2.0 mm or more and 6.0 mm or less as the insert material between a tantalum or tungsten target and the copper alloy backing plate, and to diffusion bond this in a vacuum, at a temperature between 400° C. and 548° C., and under a pressure condition of 15 to 20 kg/mm$^2$.

Thereby, a solid phase diffusion bond is formed between the tantalum or tungsten target and the aluminum or aluminum alloy, and between the copper alloy backing plate and the aluminum or aluminum alloy, and a bonded body superior in adhesiveness and bonding strength can be obtained thereby.

Sufficient bonding strength cannot be obtained when the temperature is less than 400° C. Moreover, when the temperature exceeds 548° C., this is not preferable since the eutectic temperature of the aluminum and copper will be exceeded and a liquid phase may leak as a result thereof.

Further, when the temperature exceeds 500° C., a reactive layer of several $\mu$m is formed on the boundary of the aluminum and copper, and, since such reactive layer is a hard intermetallic compound, this may not be formed too thick. Thus, it is necessary to conduct the diffusion bonding within the foregoing temperature range.

Moreover, in consideration of the sputtering target, the shape of the target and backing plate is determined, and, if the thickness of the insert material is thick, the thickness of the backing plate must be made thin relative thereto. Nevertheless, since there is a limit in making the thickness of the backing plate thin from the perspective of strength, it is desirable that the maximum thickness of the insert material of an aluminum- or aluminum alloy-sheet be ½ of the thickness of the backing plate in consideration of the above.

EXAMPLES

Next, the examples and comparative examples of the present invention will be explained. Further, these Examples are merely illustrative, and the present invention shall in no way be limited thereby. In other words, the present invention shall include all other modes or modifications other than these Examples within the scope of the technical spirit of this invention.

Example 1

A tantalum target having a diameter $\phi$ of 350 mm and a thickness of 10 mm was prepared through machine work. A copper chrome alloy was used as the backing plate.

Pure aluminum (A-1050) sheets respectively 2.0 mm and 6.0 mm were used as the insert material, and the thickness of the backing plate was made to be 19 mm when added with the thickness of the insert material.

The boundary face where the target, insert material and backing plate are to be diffusion bonded was subject to ultrasonic cleansing with acetone as the solvent, and thereafter sufficiently cleansed with isopropyl alcohol.

The assembly of the above was vacuum-sealed (degree of vacuum was 0.1 torr or less) in an iron container, and subject to diffusion bonding with hot isostatic pressing (HIP) at 500° C.×4 hr under a pressure of 15 kg/mm$^2$.

Figure 2:
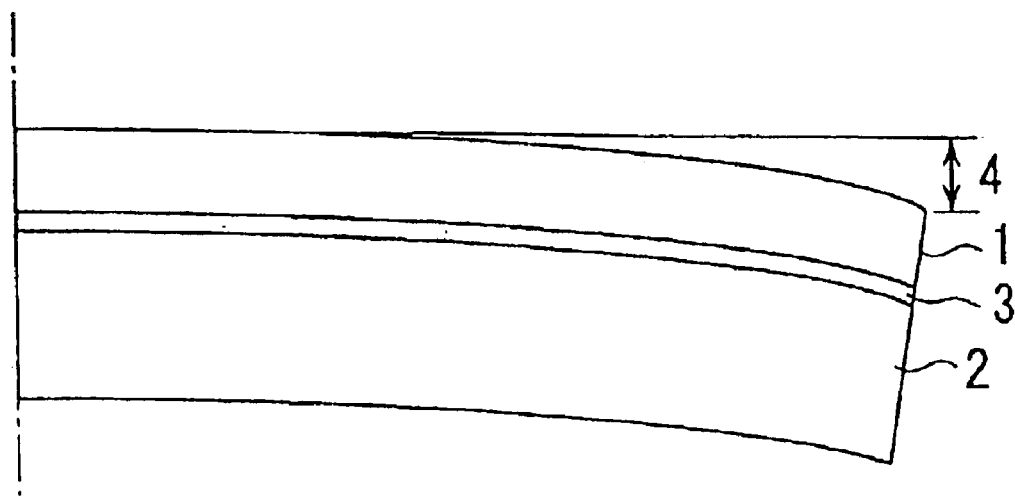
FIG. 2 is an explanatory diagram of the amount of curvature after the diffusion bonding.

The iron container was removed with machine work after the bonding. The amount of curvature was measured with a thickness gauge with the tantalum target placed on top. FIG. 2 shows the explanatory diagram of the amount of curvature after the diffusion bonding.

Comparative Example 1

With a method similar to Example 1, an aluminum insert material was inserted between the tantalum target and the copper chrome alloy backing plate, and the thickness was made to be 0.3 mm and 0.4 mm.

Moreover, a nickel sheet and a silver sheet having a thickness of 2 mm were also used as other insert materials and subject to diffusion bonding. The iron container was removed with machine work after the bonding. The amount of curvature was measured with a thickness gauge with the tantalum target placed on top. Further, the condition of the separation between the tantalum target and aluminum insert material was also observed.

The results of Example 1 and Comparative Example 1 are shown in Table 1.

TABLE 1

|  | Type of Insert Material | Thickness (mm) of Insert Material | Amount of Curvature (mm) or Existence of Separation |
| --- | --- | --- | --- |
| Example 1 | Pure Aluminum Sheet | 2.0 | 2.5 |
|  | Pure Aluminum Sheet | 6.0 | 1.7 |
| Comparative Example 1 | Pure Aluminum Sheet | 0.3 | Separation at Bonding Boundary |
|  | Pure Aluminum Sheet | 0.4 | 4 |
|  | Nickel Sheet | 2.0 | Separation at Bonding Boundary |
|  | Silver Sheet | 2.0 | Separation at Bonding Boundary |

The separation indicated in the Table refers to the separation at the bonding boundary of the tantalum target and the insert material. A1050 material of the JIS standard was used as the pure aluminum.

As shown in the Example of foregoing Table 1, when pure aluminum sheets of 2.0 mm and 6.0 mm were used as the insert material, which are within the range of the present invention, the amount of curvature was 2.5 mm and 1.7 mm, respectively, and both showed a minimal amount of curvature of less than 3 mm. Further, this amount of curvature showed a tendency of decreasing pursuant to the increase in the thickness of the aluminum sheet.

Contrarily, as shown with the Comparative Example in Table 1, when pure aluminum sheets of 0.3 mm and 0.4 mm were used as the insert material, which are outside the range of the present invention, the former showed a separation between the tantalum target and the aluminum insert material, and the latter showed a large amount of curvature at 4 mm, respectively.

In addition, when performing diffusion bonding with a nickel sheet and silver sheet having a thickness of 2 mm, regardless of the sufficient thickness, the phenomenon of a separation between the tantalum target and nickel or silver insert material was observed.

Accordingly, it is clear that the use of an aluminum sheet having a thickness within the range of the present invention as the insert material is extremely effective.

Example 2

Tungsten powder was vacuum-pressure sintered with a hot press and thereafter lathe processed to have a diameter φ of 350 mm and a thickness of 8 mm. A copper zinc alloy was used as the backing plate.

Pure aluminum (A-1050) sheets respectively 2 mm and 6 mm were used as the insert material, and the thickness of the backing plate was made to be 19 mm when added with the thickness of the insert material.

The boundary face where the target, insert material and backing plate are to be diffusion bonded was subject to ultrasonic cleansing with acetone as the solvent, and thereafter sufficiently cleansed with isopropyl alcohol. The tungsten target was further sufficiently dried with a vacuum drier.

After performing the diffusion bonding and removing the iron container with the same method as Example 1, the amount of curvature was measured with a thickness gauge with the tungsten target placed on top.

Comparative Example 2

With a method similar to Example 2, an aluminum insert material was inserted between the tungsten target and the copper zinc alloy backing plate, and the thickness of such aluminum insert was made to be 0.3 mm and 0.4 mm. Moreover, a nickel sheet and a silver sheet having a thickness of 2 mm were also used as other insert materials and subject to diffusion bonding.

The amount of curvature was measured with a thickness gauge with the tungsten target placed on top. Further, the condition of the separation between the tungsten target and aluminum insert material was also observed.

The results of Example 2 and Comparative Example 2 are shown in Table 2.

TABLE 2

| | Type of Insert Material | Thickness (mm) of Insert Material | Amount of Curvature (mm) or Existence of Separation |
|---|---|---|---|
| Example 2 | Pure Aluminum Sheet | 2.0 | 2.6 |
| | Pure Aluminum Sheet | 6.0 | 1.7 |
| Comparative Example 2 | Pure Aluminum Sheet | 0.3 | 4.3 (Crack in Target) |
| | Pure Aluminum Sheet | 0.4 | 4.3 (Crack in Target) |
| | Nickel Sheet | 2.0 | Separation at Bonding Boundary |
| | Silver Sheet | 2.0 | Separation at Bonding Boundary |

The separation indicated in the Table refers to the separation at the bonding boundary of the tungsten target and the insert material. A1050 material of the JIS standard was used as the pure aluminum.

As shown in the Example of foregoing Table 2, when pure aluminum sheets of 2.0 mm and 6.0 mm were used as the insert material, which are within the range of the present invention, the amount of curvature was 2.6 mm and 1.7 mm, respectively, and both showed a minimal amount of curvature of less than 3 mm. Further, this amount of curvature showed a tendency of decreasing pursuant to the increase in the thickness of the aluminum sheet.

Contrarily, as shown with the Comparative Example in Table 2, when pure aluminum sheets of 0.3 mm and 0.4 mm were used as the insert material, which are outside the range of the present invention, the tungsten target cracked and showed a large amount of curvature at approximately 4 mm.

In addition, when performing diffusion bonding with a nickel sheet and silver sheet having a thickness of 2 mm, regardless of the sufficient thickness, the phenomenon of a separation between the tungsten target and aluminum insert material was observed.

Accordingly, from Example 2 also, it is clear that the use of an aluminum sheet having a thickness within the range of the present invention as the insert material is extremely effective.

Moreover, although pure aluminum was used as the insert material in the present Examples, it has been confirmed that similar results could be obtained with aluminum alloy sheets such as A5052 or the like.

Obtained is a tantalum or tungsten target-copper alloy backing plate assembly which suffers only a small deformation after the diffusion bonding even when the target and the backing plate differ greatly in the thermal expansion coefficient, and which is free from separation between the target and the backing plate or from cracking. Moreover, by reducing the amount of curvature after the diffusion bonding, the guarantee of the target thickness is facilitated, the target yield ratio is improved, and the cutting process or correction process after the bonding can be alleviated. A superior effect is yielded in that a highly reliable target assembly capable of surviving high power sputtering and being compatible with the enlargement of the target is provided.

FIG. 1

1 Target Material
2 Backing Plate Material
3 Insert Material

FIG. 2

1 Target Material
4 Amount of Curvature (mm)

What is claimed is:

1. A tantalum or tungsten target-copper alloy backing plate assembly comprising one of a tantalum and tungsten target and one of a copper chrome alloy and copper zinc alloy backing plate which are diffusion bonded via one of an aluminum- and aluminum alloy-sheet insert material having a thickness between 2.0 mm and 6.0 mm, wherein the assembly has diffusion bonded interfaces between the respective materials, and wherein the assembly has an amount of curvature after bonding of 3 mm or less.

2. A production method of a tantalum or tungsten target-copper alloy backing plate assembly, comprising the step of diffusing bonding one of a tantalum and tungsten target and one of a copper chrome alloy and copper zinc alloy backing plate via one of an aluminum- and aluminum alloy-sheet insert material having a thickness between 2.0 mm and 6.0 mm in a vacuum, at a temperature between 400° C. and 548° C., and under a pressure condition of 15 to 20 kg/mm$^2$, wherein the assembly has an amount of curvature after bonding of 3 mm or less.

* * * * *